United States Patent

[11] 3,551,757

[72] Inventor IB Knud Kristensen
Nordborg, Denmark
[21] Appl. No. 593,403
[22] Filed Nov. 10, 1966
[45] Patented Dec. 29, 1970
[73] Assignee Danfoss AS
Nordborg, Denmark
a company of Denmark

[54] ZENER DIODE MADE WITHOUT DOPING OF SEMICONDUCTOR MATERIAL
1 Claim, 4 Drawing Figs.

[52] U.S. Cl. .......... 317/234, 317/235; 307/318
[51] Int. Cl. .......... H01l 9/00
[50] Field of Search .......... 317/235, 234, 6, 10, 26, 30, 31; 307/318

[56] References Cited
UNITED STATES PATENTS

| | | | |
|---|---|---|---|
| 3,349,297 | 10/1967 | Crowell et al. | 317/234 |
| 3,448,349 | 6/1969 | Sumner | 317/234 |
| 3,185,935 | 5/1965 | White | 333/30 |
| 3,263,095 | 7/1966 | Fang | 307/88.5 |
| 3,290,127 | 12/1966 | Kahng et al. | 29/195 |

*Primary Examiner*—John W. Huckert
*Assistant Examiner*—R. F. Polissack
*Attorneys*—Robert E. Burns and Emmanuel J. Lobato

ABSTRACT: A semiconductor diode having Zener characteristics having a body of semiconductor material between metallic electrodes bearing with pressure on the semiconductor material to form a surface area contact defining a rectifying barrier layer between the electrode without doping of the semiconductor material. Conduction can occur in the semiconductor material by a form of field emission that suddenly increases the number of carriers in the barrier layer upon application of a potential across the barrier layer in a direction and magnitude to effect nondestructive breakdown of the barrier layer. Another body of semiconductor material is sandwiched between one of the metallic electrodes and another metallic electrode forming a surface area contact defining a rectifying barrier layer between the electrodes and similar to the first-mentioned layer. Means are provided to hold the electrodes applying pressure to each body of material and ohmic contacts are provided to apply the potential to the outermost electrodes and the entire assembly can function as two diodes in series.

PATENTED DEC 29 1970 3,551,757

INVENTOR.
IB KNUD KRISTENSEN

ZENER DIODE MADE WITHOUT DOPING OF SEMICONDUCTOR MATERIAL

The present invention relates to a voltage sensitive semiconductor element of the Zener diode type, and more particularly to such an element which is so constructed that its characteristics are readily reproducible.

The manufacture of Zener diodes, and semiconductor resistances which are voltage sensitive in general, is complicated by the fact that it is difficult to manufacture such units with precisely identical characteristics. In the manufacture of a *pn* junction, a body of semiconductor material of one type of conductivity is doped at one side, for example by diffusion, in order to provide a zone of material having a conductivity of opposite type. This method results in a very useful element; it is, however, complicated to make, and the process is costly and difficult to control.

It is an object of the present invention to provide a voltage sensitive semiconductor resistance, particularly of the Zener diode type, which can be manufactured readily and with reproducible characteristics.

Briefly, in accordance with the present invention, a barrier layer contact, that is a Schottky contact, is made between a metallic, conductive element and a semiconductor, and operated in the breakdown region.

The rectifying effect of barrier regions has been well described and is known. Insofar as investigation of the barrier effect was made, however, they appeared to have stopped with the investigation of the barrier region itself. The present invention is based on the realization that at the edge, beyond the barrier region itself, a breakdown occurs which permits stable operation unless defects or discontinuities in the crystal itself interfere with stability and reproducibility. It is well known that a barrier layer contact can be manufactured cheaper, and with a greater degree of certainty of reproducibility than diffusion junctions, alloy junctions, grown junctions, or other processes of making a *pn* junction.

The preferred semiconductive material for use in the semiconductor elements in the present invention should have a band gap of at least 1.1 ev., preferably 1.3 ev. and more. The band gap, of course, is the width of the forbidden region between the conduction band and the valence band. The greater the band gap, the less the possibility that electrons change is state due to external energy, and thus interfere with the desired results. External energy may be supplied in the form of increased temperature, which frequently is the result of increase in current. It is typical, for example, silicon, having a band gap of 1.1 ev. has a high degree of voltage dependence on current, thus forms a very useful voltage dependent semiconductor resistance; gallium arsenide, having a band width of about 1.4 ev., with increase in current, shows an approximately constant potential and is thus useful as a Zener diode. Indium phosphide, having a band gap of 1.3 ev. is similarly practically voltage independent of current.

Symmetrical semiconductor resistances, and particularly double Zener diodes, heretofore have required even greater manufacturing selectivity than single elements, because doping of two sides of a single semiconductor chip is difficult and time consuming. Thus, it was customary to use serial connection of a pair of matched elements.

The invention is readily applicable to the manufacture of symmetrical, voltage dependent semiconductor resistances, particularly double Zener diodes, by applying a pair of barrier layer electrodes to a semiconductor body. Such a double Zener diode can be manufactured even simpler than a simple, single Zener diode, since two barrier layers are provided which may be identical, and no ohmic contact, which is more difficult to apply than a barrier layer, is necessary at all.

The breakdown, or Zener potential, depends in a large measure on the specific resistivity of the semiconductor material. For example, gallium arsenide with a specific resistance of 0.1 ohm. cm has a Zener potential of 10—15 v. If a different Zener potential is desired, a somewhat differently doped semiconductor material is chosen. It is also possible to place several semiconductor resistances, or Zener diodes in series. In such case it is recommended that at least two semiconductor bodies have a common electrode of metallic conductive material. For example, three electrodes, and two semiconductor bodies, may form a double Zener diode with doubled Zener potential. The common electrode may also be used when various semiconductor bodies are to be connected in parallel.

A very suitable material for an electrode is graphite, since graphite does not form surface oxides, and thus does not cause difficulty in further application. Other materials for electrodes are, for example, silver and molybdenum. In a preferred form, the semiconductor material and metallically conductive material form an area contact. Good mechanical stability is obtained and larger currents can be carried. It is also possible to use mechanical pressure in the formation of the barrier layer; a semiconductor body can be sandwiched between a pair of metallic, conductive electrodes and secured by pressure therein. According to another method, the metallic conductive layer can be applied by cathodic deposition.

The structure, organization and operation of the invention will now be described more specifically in the following detailed description with reference to the accompanying drawings, in which.

Figure 1:
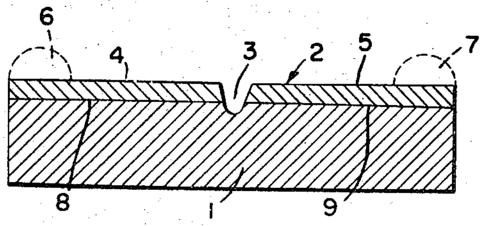
FIG. 1 is a cross-sectional view through an embodiment of the present invention.

Referring now to the drawings and in particular to FIG. 1: a semiconductor body 1, for example gallium arsenide, has a layer 2 of a metallic, conductive material applied thereto, which may be silver. As a method of application, cathodic deposition is suitable. A notch 3 is formed in layer 2 and thus the layer is separated into a pair of electrodes 4, 5, which are connected to ohmic contacts 6, 7. The surface regions of contact, 8 and 9, between semiconductor body 1 and electrodes 4 and 5, form a barrier layer or Schottky contact which, when a potential is applied to the edge, forms a space discharge layer at the surface region at the boundary with the semiconductor body.

Figure 2:
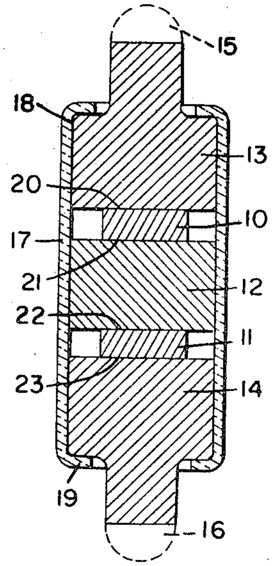
FIG. 2 is a cross-sectional view through another embodiment.

FIG. 2 is a form of the invention in which a pair of gallium arsenide discs on each side are in contact with a graphite body 12; at their outer sides, they are contacted by graphite bodies 13 and 14, each of which has contacts 15 and 16 respectively, applied thereto. The entire assembly is enclosed in a small glass tube 17. The elements 10 to 14 are inserted in the glass tube and pressed together. While being held together under pressure, the ends 18 and 19 of the glass tubes are softened and peened over to retain the elements 10—14 securely within the interior of tube 17 and under pressure. Thus four barrier layer surfaces, each forming a Schottky contact 20—24 are formed which operate in the same sense in pairs 20, 22 and 21, 23. Thus, a double Zener diode having double Zener potential is formed.

No particular surface preparation of the surfaces of the semiconductor and of the metallic conductive material is necessary. The effects above described are already obtained when a small chip of gallium arsenide, for example as obtained by breaking a larger piece with a hammer, is placed between a pair of graphite electrodes. Instead of such a plain breaking, a polished or ground surface can be used which may be etched as desired. The important point is that the surface zone contains defects which can accept charge carriers. It is not necessary that the discs 10, 11 in embodiment of FIG. 2 are arranged concentrically; the operation of the device is governed by the relationship of the contact surfaces.

Figure 3:
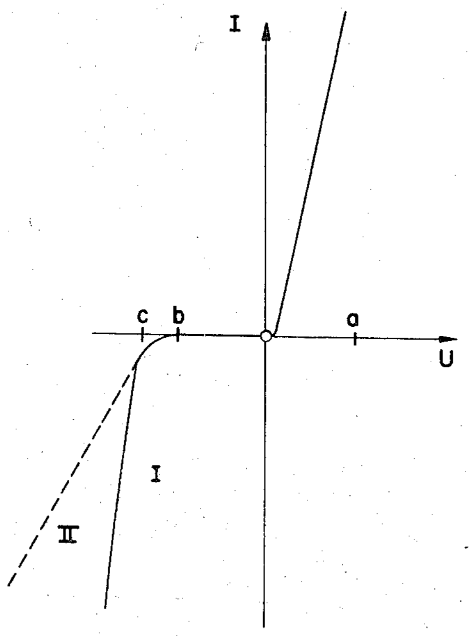
FIG. 3 is a current-voltage (I-U) diagram illustrating the characteristic curves for several embodiments.

The current-voltage diagram in FIG. 3 shows the current of a barrier layer contact as it depends on voltage. The rectifying characteristics of such a contact is within the region of points *a* and *b*. The region in the third quadrant, at the left, is not considered in more detail, and is not being used. In accordance with the invention, the barrier layer contact is operated in the breakdown region in the blocking direction, that is beyond the potential of point *c*. Curve I is obtained from a semiconductor material having a quite wide band gap. The breakdown is dependent almost exclusively on the electrical field strength which clearly appears from the even voltage curve. Curve II is obtained from a semiconductor material having a small band gap in which thermal influences arising during breakdown already are apparent, as can be seen from the substantial current dependence of the potential.

Figure 4:
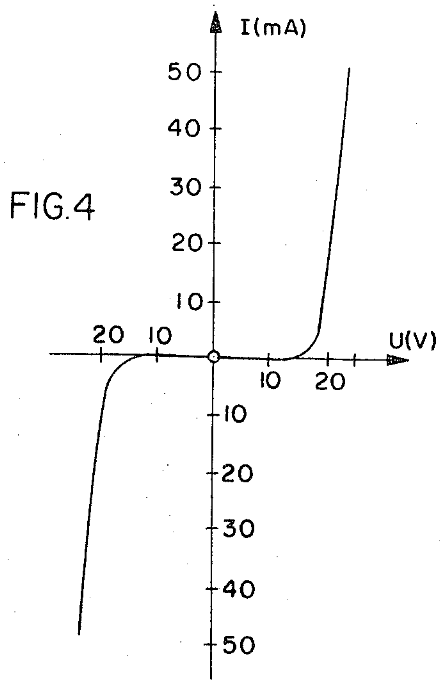
FIG. 4 illustrates the characteristics in a current-voltage diagram of a double Zener diode consisting of gallium arsenide and graphite.

The diagram of FIG. 4 illustrates test results with a double Zener diode consisting of one gallium arsenide body having oppositely applied graphite electrodes. The test results were as follows:

TABLE I

| | | | | | | | | |
|---|---|---|---|---|---|---|---|---|
| Ma | 0.02 | 7 | 14 | 21 | 28 | 35 | 42 | 49 |
| Volt | 10 | 19 | 20 | 21.5 | 22.0 | 22.5 | 23.0 | 24.0 |

I claim:

1. A semiconductor diode having Zener characteristics comprising, a body of semiconductor material, metallic electrodes bearing with pressure on the semiconductor material to form a surface area contact defining a rectifying barrier layer between the electrodes without doping of said semiconductor material through which conduction can occur by a form of field emission that suddenly increases the number of carriers in said barrier layer upon application of a potential across said barrier layer in a direction and magnitude to effect nondestructive breakdown of said barrier layer, said body of semiconductor material being sandwiched between said electrodes, another body of semiconductor material sandwiched between one of said metallic electrodes and another metallic electrode forming a surface area contact defining a rectifying barrier layer between the electrodes and similar to the first-mentioned barrier layer, means holding the electrodes applying pressure to each body of material, said ohmic contacts to apply said potential to outermost electrodes, whereby the entire assembly constitutes two diodes in series.